(12) United States Patent
Choi

(10) Patent No.: US 7,498,866 B2
(45) Date of Patent: Mar. 3, 2009

(54) HIGH VOLTAGE PUMPING DEVICE

(75) Inventor: Hyang Hwa Choi, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 93 days.

(21) Appl. No.: 11/648,330

(22) Filed: Dec. 29, 2006

(65) Prior Publication Data

US 2007/0241808 A1   Oct. 18, 2007

(30) Foreign Application Priority Data

Apr. 12, 2006 (KR) .................... 10-2006-0033333

(51) Int. Cl.
*G05F 1/10* (2006.01)
*G05F 3/02* (2006.01)

(52) U.S. Cl. .................... 327/536; 327/537; 363/59; 363/60

(58) Field of Classification Search .................... 327/536, 327/537; 363/59, 60
See application file for complete search history.

(56) References Cited

U.S. PATENT DOCUMENTS

| 5,319,604 | A | * | 6/1994 | Imondi et al. .......... 365/185.18 |
| 5,526,364 | A | * | 6/1996 | Roohparvar ................ 714/724 |
| 5,751,944 | A | * | 5/1998 | Roohparvar et al. .......... 714/42 |
| 5,889,664 | A | * | 3/1999 | Oh .............................. 363/60 |
| 5,999,040 | A | * | 12/1999 | Do et al. .................... 327/536 |
| 6,320,457 | B1 | * | 11/2001 | Yang .......................... 327/536 |
| 6,337,595 | B1 | * | 1/2002 | Hsu et al. ................... 327/538 |
| 6,370,075 | B1 | * | 4/2002 | Haeberli et al. ............. 365/226 |
| 6,407,581 | B1 | * | 6/2002 | Hull et al. ..................... 326/83 |
| 6,429,732 | B1 | * | 8/2002 | Tedrow et al. .............. 327/548 |
| 6,456,541 | B2 | * | 9/2002 | Tanzawa ................ 365/189.11 |
| 6,518,831 | B1 | * | 2/2003 | Hur et al. .................... 327/537 |
| 6,577,555 | B2 | * | 6/2003 | Roohparvar ............. 365/233.1 |
| 6,667,662 | B2 | * | 12/2003 | Saito .......................... 331/1 A |
| 6,700,434 | B2 | * | 3/2004 | Fujii et al. .................. 327/534 |
| 6,760,262 | B2 | * | 7/2004 | Haeberli et al. ........ 365/189.09 |

(Continued)

FOREIGN PATENT DOCUMENTS

KR   10-1999-0053727   7/1999

*Primary Examiner*—Kenneth B Wells
*Assistant Examiner*—Adam Houston
(74) *Attorney, Agent, or Firm*—John P. White; Cooper & Dunham LLP

(57) ABSTRACT

A high voltage pumping device is provided which includes a first high voltage detector for detecting a level of a high voltage, and generating a first pumping enable signal which is enabled when the high voltage is lower than a predetermined reference voltage, a pumping control signal generator for generating a pumping control signal adapted to control a high voltage pumping operation, in response to the first pumping enable signal and a first control signal which is enabled for a first period when an active mode is begun, an oscillator for generating a predetermined oscillation signal in response to the pumping control signal, and a pumping unit for pumping the high voltage to a predetermined level in response to the oscillation signal supplied from the oscillator. The high voltage pumping device performs an initial high voltage pumping operation for a second period in response to the first control signal when the active mode is begun, and subsequently performs a high voltage pumping operation in the active mode in response to the first pumping enable signal when the high voltage is lower than the predetermined reference voltage.

19 Claims, 4 Drawing Sheets

U.S. PATENT DOCUMENTS

| | | | |
|---|---|---|---|
| 6,778,003 B1 * | 8/2004 | Callaway et al. | 327/536 |
| 6,784,723 B2 * | 8/2004 | Lee et al. | 327/536 |
| 6,847,250 B2 * | 1/2005 | Kim | 327/536 |
| 6,919,756 B2 * | 7/2005 | Callaway et al. | 327/536 |
| 6,944,812 B2 * | 9/2005 | Chevallier | 714/745 |
| 7,095,269 B2 * | 8/2006 | Yamada | 327/537 |
| 7,151,702 B2 | 12/2006 | Han et al. | |
| 2002/0017946 A1 * | 2/2002 | Fujii et al. | 327/534 |
| 2002/0033731 A1 * | 3/2002 | Lee et al. | 327/536 |
| 2003/0135801 A1 * | 7/2003 | Chevallier | 714/724 |
| 2005/0062520 A1 * | 3/2005 | Kim et al. | 327/536 |
| 2005/0206440 A1 * | 9/2005 | Do | 327/536 |
| 2006/0002209 A1 * | 1/2006 | Chevallier | 365/201 |
| 2008/0074170 A1 * | 3/2008 | Hsu | 327/536 |

* cited by examiner

HIGH VOLTAGE PUMPING DEVICE

BACKGROUND

The present disclosure relates to a high voltage pumping device, and, more particularly, to a high voltage pumping device which enables a semiconductor memory device to operate normally, by preventing the level of a high voltage used in the semiconductor memory device from being dropped excessively below an appropriate range due to an excessive use of the high voltage when the semiconductor memory device enters an active mode, and thus, maintaining the level of the high voltage within the appropriate range.

Generally, DRAM is a random access memory capable of writing or reading data in or from a memory cell consisting of one transistor and one capacitor. Such a DRAM mainly uses an NMOS transistor for the transistor constituting each memory cell of the DRAM. For this reason, the DRAM must include a voltage pumping device which generates a drive voltage higher than the sum of an external supply voltage Vdd and a threshold voltage Vt by "ΔV" (namely, "Vdd+Vt+ΔV"), for driving word lines, taking into consideration a voltage loss caused by the threshold voltage Vt.

This will be described in more detail. In order to turn on the NMOS transistor used in each DRAM memory cell of the DRAM, it is necessary to apply, to the gate of the NMOS transistor, a voltage higher than a source voltage by a threshold voltage Vt or more. However, since the maximum level of a voltage applicable to the DRAM corresponds to the level of the external supply voltage Vdd, it is necessary to apply a voltage boosted to a level of "Vdd+Vt" or more to the gate of the NMOS transistor, in order to enable the DRAM to read a voltage having a level corresponding to Vdd from a cell or a bit line or to write the voltage in the cell or bit line. Therefore, in order to drive word lines of the DRAM device, a voltage pumping device is used which generates a high voltage Vpp as the boosted voltage.

In conventional cases, however, such a voltage pumping device has a problem in that the level of a high voltage pumped by the voltage pumping device is typically dropped below an appropriate range due to excessive use of the high voltage when the semiconductor memory device, to which the voltage pumping device is applied, enters an active mode, thereby causing the semiconductor memory device to operate erroneously. This problem will be described in detail hereinafter with reference to FIGS. 1 to 3. For reference, "active mode" means a mode in which a word line is activated for a data read or write operation of an associated cell, that is, a mode executed during a period until a precharge operation is begun after activation of the word line according to enabling of a row active signal. The row active signal is a control signal used to activate the word line when the active mode is begun. Also, a precharge signal is used which is activated when a precharge mode is begun.

Referring to FIG. 1, a conventional high voltage pumping device is illustrated. The conventional high voltage pumping device includes a high voltage detector 110 which detects the level of a high voltage VPP fed back thereto, and outputs a pumping enable signal ppea in response to the detected level of the high voltage VPP. The pumping enable signal ppea is enabled when the high voltage VPP is lower than a predetermined reference voltage.

The pumping enable signal ppea is input to a pumping control signal generator 120 which also receives a row active signal ractbp and a precharge signal rpcgbp. Based on the received signals, the pumping control signal generator 120 generates a pumping control signal vppact for controlling a high voltage pumping operation. This will be described in detail. First, the row active signal ractbp is latched by a latching unit 121, as shown in FIG. 2. As shown in FIG. 3, the latching unit 121 then outputs a control signal rastb, which is maintained at a low level (namely, in an active state) from the point of time when the row active signal ractbp is activated to the point of time when the precharge signal rpcgbp is activated, namely, a period for which the active mode is executed. The control signal rastb is delayed for a predetermined period by a delaying unit 122. In particular, the delaying unit 122 delays the active state of the control signal rastb. As a result, a control signal vpa having a waveform as shown in FIG. 3 is output from an inverter IV11. The control signal vpa is applied to a logic unit 123 which, in turn, ANDs the control signal vpa with the pumping enable signal ppea, and outputs a pumping control signal vppact. The pumping control signal vppact is activated when the pumping enable signal ppea is enabled under the condition in which the control signal vpa is enabled.

The pumping control signal vppact is applied to an oscillator 130, as shown in FIG. 1. In response to the pumping control signal vppact, the oscillator 130 generates an oscillation signal osc which is, in turn, applied to a pumping unit 140. The pumping unit 140 pumps the high voltage VPP to a predetermined level in response to the oscillation signal osc.

The above-mentioned operation of the conventional high voltage pumping device will be summarized hereinafter. When the high voltage VPP fed back to the high voltage pumping device is lower than a predetermined reference voltage, the pumping enable signal ppea output from the high voltage detector 110 is enabled. When the pumping control signal vppact output from the pumping control signal generator 120 is enabled in the active mode under the condition in which the pumping enable signal ppea has been enabled, the oscillator 130 outputs the oscillation signal osc. In response to the oscillation signal osc, the pumping unit 140 performs a pumping operation for the high voltage VPP. Thus, the high voltage VPP output from the high voltage pumping device can be maintained at a predetermined level.

However, the above-mentioned conventional high voltage pumping device has a problem in that the level of the high voltage is dropped to a level lower than an appropriate range due to excessive use of the high voltage when the active mode is begun. That is, when the semiconductor memory device which uses the conventional high voltage pumping device enters the active mode in accordance with activation of the row active signal ractbp, the high voltage VPP is not only used to drive word lines, but also used for other purposes, for example, as a bit line isolation signal BISH or BISL. As a result, the level of the high voltage VPP is dropped. In order to compensate for the dropped high voltage VPP, it is necessary to perform a pumping operation for the high voltage VPP. However, since the pumping operation is carried out based on sensing of the dropped high voltage VPP, a certain time is inevitably taken prior to the pumping operation, due to the sensing operation. For this reason, there is a problem in that the level of the high voltage VPP is excessively dropped below an appropriate range when the active mode is begun because the dropped high voltage VPP cannot be immediately compensated for. The excessive drop of the high voltage VPP adversely affects operation of sense amplifiers and activation of word lines, thereby causing the semiconductor memory device to operate erroneously.

There is a need for a high voltage pumping device which enables a semiconductor memory device to operate normally, by preventing the level of a high voltage used in the semiconductor memory device from being excessively dropped below an appropriate range due to an excessive use of the high voltage when the semiconductor memory device enters an active mode, and thus, maintaining the level of the high voltage within the appropriate range.

BRIEF SUMMARY

In a preferred embodiment of the present disclosure, a high voltage pumping device comprises a first high voltage detector for detecting a level of a high voltage, and generating a first pumping enable signal which is enabled when the high voltage is lower than a predetermined reference voltage, a pumping control signal generator for generating a pumping control signal adapted to control a high voltage pumping operation, in response to the first pumping enable signal and a first control signal which is enabled for a first period when an active mode is begun, an oscillator for generating a predetermined oscillation signal in response to the pumping control signal, and a pumping unit for pumping the high voltage to a predetermined level in response to the oscillation signal supplied from the oscillator. The high voltage pumping device performs an initial high voltage pumping operation for a second period in response to the first control signal when the active mode is begun, and subsequently performs a high voltage pumping operation in the active mode in response to the first pumping enable signal when the high voltage is lower than the predetermined reference voltage.

The initial high voltage pumping operation may be performed only when the high voltage is lower than a predetermined maximum allowable voltage.

The high voltage pumping device may further comprise a second high voltage detector for detecting the level of the high voltage, and generating a second pumping enable signal which is enabled when the high voltage is lower than the predetermined maximum allowable voltage.

The pumping control signal generator may receive the second pumping enable signal, and enable the pumping control signal for the second period in response to the second pumping enable signal and the first control signal when the active mode is begun, while enabling the pumping control signal during the active mode in response to the first pumping enable signal.

The pumping control signal generator may comprise a latch for latching the first control signal, and outputting a second control signal which is maintained in an active state during the active mode, a first buffer for buffering the second control signal, a first logic unit for performing a logical operation of the first pumping enable signal and an output signal from the first buffer, and outputting a result of the logical operation, a sensing unit for sensing an activation of the first control signal, and generating an activation sensing signal which is enabled for the second period, and a second logic unit for performing a logical operation of an output signal from the first logic unit and the activation sensing signal.

The latch may maintain the second control signal in the active state until a precharge signal is enabled.

The pumping control signal generator may further comprise a delaying unit for delaying the second control signal output from the latch, and outputting the delayed second control signal to the first buffer.

The delaying unit may delay the active state of the second control signal for a predetermined period.

The delaying unit may comprise a second buffer for buffering the second control signal, a delay for delaying an output signal from the second buffer for a predetermined period, and a third logic unit for performing a logical operation of the output signal from the second buffer and an output signal from the delay.

The third logic unit may perform a NOR operation.

The sensing unit may comprise a second buffer for buffering the first control signal, a third logic unit for performing a logical operation of an output signal from the second buffer and the second pumping enable signal, a delay for delaying an output signal from the third logic unit for a predetermined period, and a fourth logic unit for performing a logical operation of the output signal from the third logic unit and an output signal from the delay.

In another embodiment of the present disclosure, a high voltage pumping device comprises a first high voltage detector for detecting a level of a high voltage, and generating a first pumping enable signal which is enabled when the high voltage is lower than a predetermined reference voltage, a second high voltage detector for detecting the level of the high voltage, and generating a second pumping enable signal which is enabled when the high voltage is lower than a predetermined maximum allowable voltage, a pumping control signal generator for generating a pumping control signal in response to the first pumping enable signal, the second pumping enable signal, and a first control signal which is enabled for a first period when an active mode is begun, the pumping control signal being enabled for a second period in response to the second pumping enable signal and the first control signal when the active mode is begun, while being enabled in response to the first pumping enable signal during the active mode, an oscillator for generating a predetermined oscillation signal in response to the pumping control signal, and a pumping unit for performing a pumping operation in response to the oscillation signal supplied from the oscillator.

BRIEF DESCRIPTION OF THE DRAWINGS

The above-mentioned and other features and advantages of the subject matter of the present disclosure will be more clearly understood from the following detailed description considered in conjunction with the accompanying drawings, in which.

DESCRIPTION OF SPECIFIC PREFERRED EMBODIMENTS

Hereinafter, the subject matter of the present disclosure will be described in detail, in conjunction with exemplary embodiments. These embodiments are used only for illustrative purposes, and the present disclosure is not limited thereto.

Figure 1:
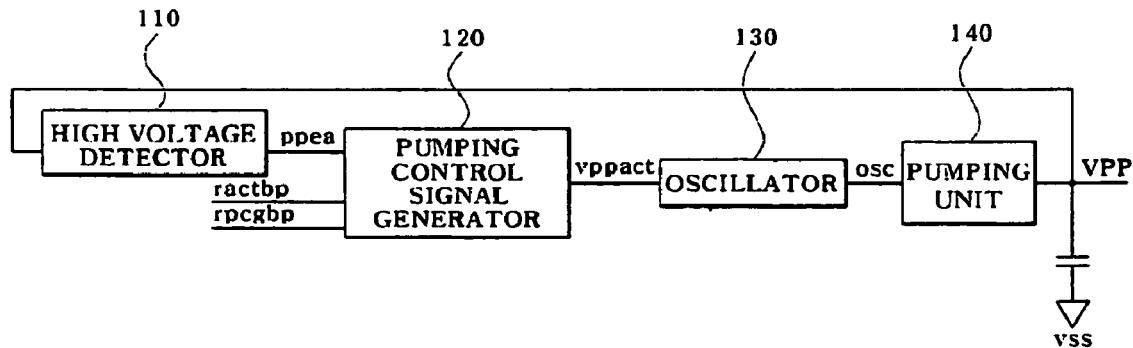
FIG. 1 is a block diagram illustrating a conventional high voltage pumping device.
Figure 2:
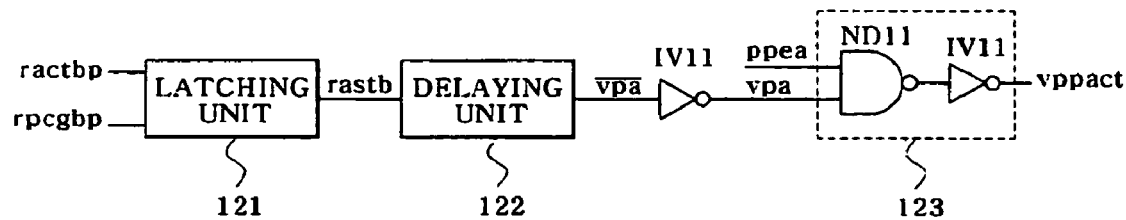
FIG. 2 is a circuit diagram illustrating a configuration of a pumping control signal generator used in the conventional high voltage pumping device.
Figure 3:
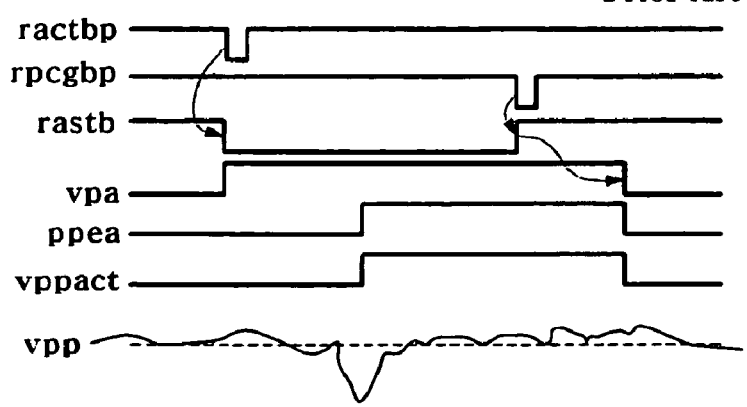
FIG. 3 is a timing diagram for explaining operation of the conventional high voltage pumping device.
Figure 4:
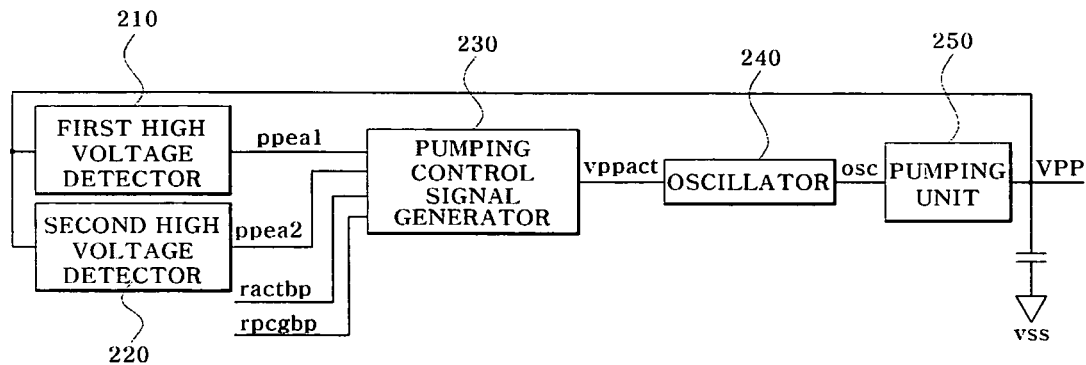
FIG. 4 is a block diagram illustrating a configuration of a high voltage pumping device according to an exemplary embodiment of the present disclosure.
Figure 5:
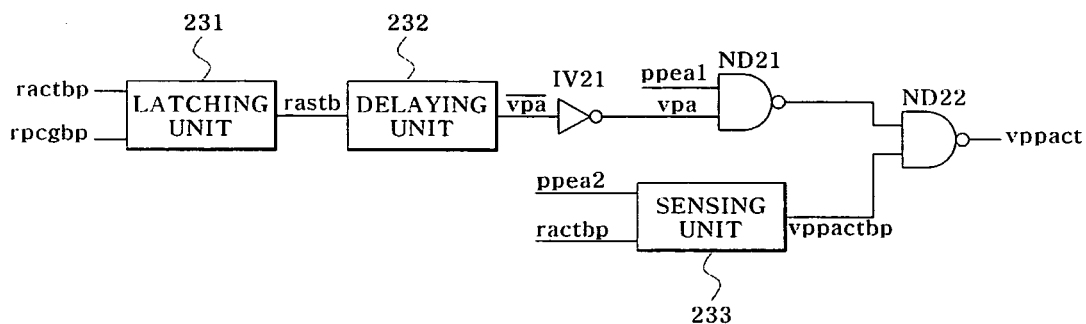
FIG. 5 is a circuit diagram illustrating a configuration of a pumping control signal generator used in the high voltage pumping device of FIG. 4.
Figure 6A:
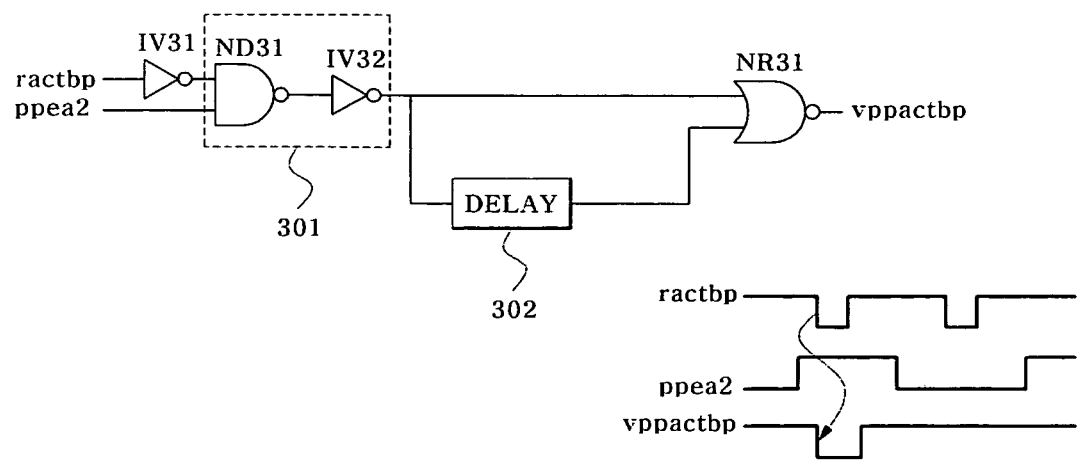
FIGS. 6A and 6B are circuit diagrams illustrating a configuration of a sensing unit included in the pumping control signal generator of FIG. 5, together with a timing diagram of input and output signals associated with the sensing unit.
Figure 6B:
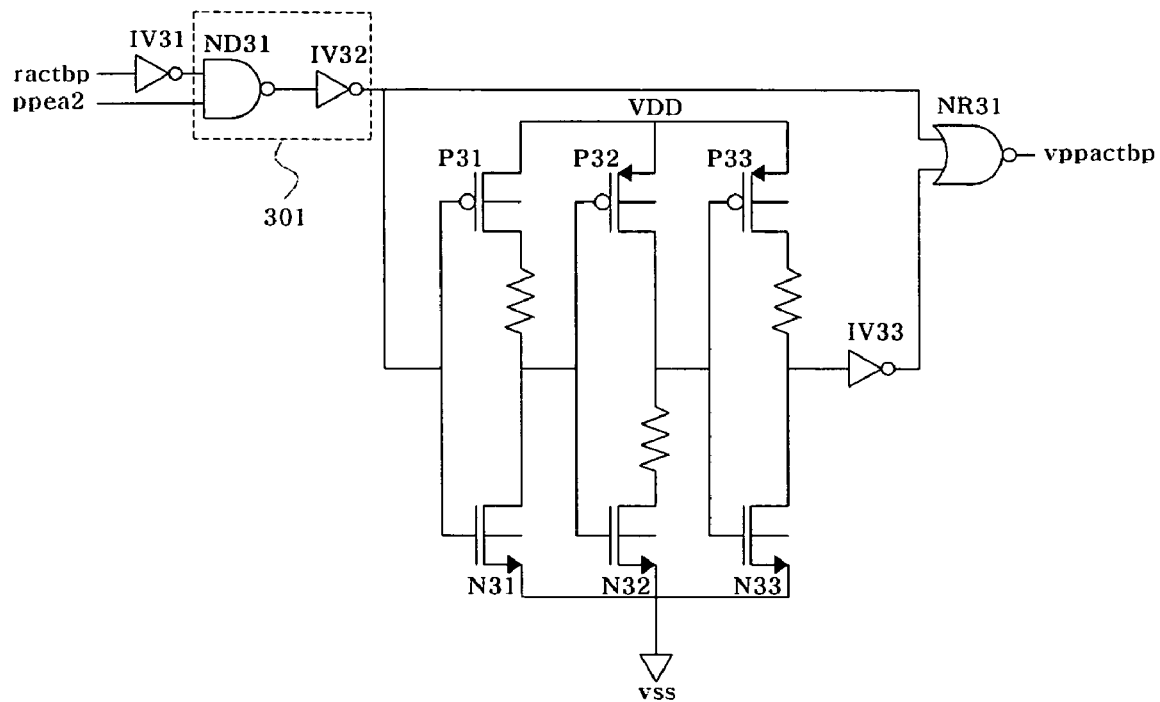

FIG. 4 is a block diagram illustrating a configuration of a high voltage pumping device according to an exemplary embodiment of the present disclosure. FIG. 5 is a circuit diagram illustrating a configuration of a pumping control signal generator used in the high voltage pumping device of FIG. 4. FIGS. 6A and 6B are circuit diagrams illustrating a configuration of a sensing unit included in the pumping control signal generator of FIG. 5.

As shown in FIG. 4, the high voltage pumping device according to the preferred embodiment includes a first high voltage detector 210 for detecting the level of a high voltage VPP, and generating a pumping enable signal ppeal. The pumping enable signal ppeal is enabled when the high voltage VPP is lower than a predetermined reference voltage. The high voltage pumping device also includes a pumping control signal generator 230 for generating a pumping control signal vppact adapted to control a high voltage pumping operation, in response to the pumping enable signal ppeal together with a row active signal ractbp, which is enabled for a first period when the active mode is begun. The high voltage pumping device further includes an oscillator 240 for generating a predetermined oscillation signal osc in response to the pumping control signal vppact, and a pumping unit 250 for pumping the high voltage VPP to a predetermined level in response to the oscillation signal osc supplied from the oscillator 240.

The high voltage pumping device further includes a second high voltage detector for detecting the level of the high voltage VPP, and generating a second pumping enable signal ppea2. The second pumping enable signal ppea2 is enabled when the high voltage VPP is lower than a maximum allowable voltage.

Operation of the high voltage pumping device having the above-described configuration according to the illustrated embodiment will be described with reference to FIGS. 4 through 8.

As shown in FIG. 4, the first high voltage detector 210 detects the level of the high voltage VPP fed back thereto, and outputs the pumping enable signal ppeal. The pumping enable signal ppeal is enabled when the high voltage VPP is lower than the predetermined reference voltage.

The second high voltage detector 220 detects the high voltage VPP fed back thereto, and outputs the pumping enable signal ppea2. The pumping enable signal ppea2 is enabled when the high voltage VPP is lower than the maximum allowable voltage. The pumping enable signal ppea2 functions to prevent the high voltage VPP from increasing excessively to the maximum allowable voltage or more, because it is enabled when it is lower than the maximum allowable voltage. The second high voltage detector 220 has the same basic configuration as the first high voltage detector 210.

The pumping control signal generator 230 receives the pumping enable signals ppeal and ppea2, and the row active signal ractbp, and outputs the pumping control signal vppact adapted to control a high voltage pumping operation, based on the received signals. That is, when the active mode is begun, the pumping control signal generator 230 enables the pumping control signal vppact in response to the pumping enable signal ppea2 and row active signal ractbp, and outputs the enabled pumping control signal vppact for a predetermined period. In a subsequent active mode period, the pumping control signal generator 230 enables the pumping control signal vppact in response to the pumping enable signal ppeal, and outputs the enabled pumping control signal vppact. This will be described in detail with reference to FIGS. 5 through 8. For reference, the active mode means a mode in which a word line is activated for a data read or write operation of an associated cell, that is, a mode executed during a period until a precharge operation is begun after activation of the word line according to enabling of a row active signal. The row active signal ractbp is a control signal used to activate the word line when the active mode is begun. Also, a precharge signal is used which is activated when a precharge mode is begun.

Figure 8:
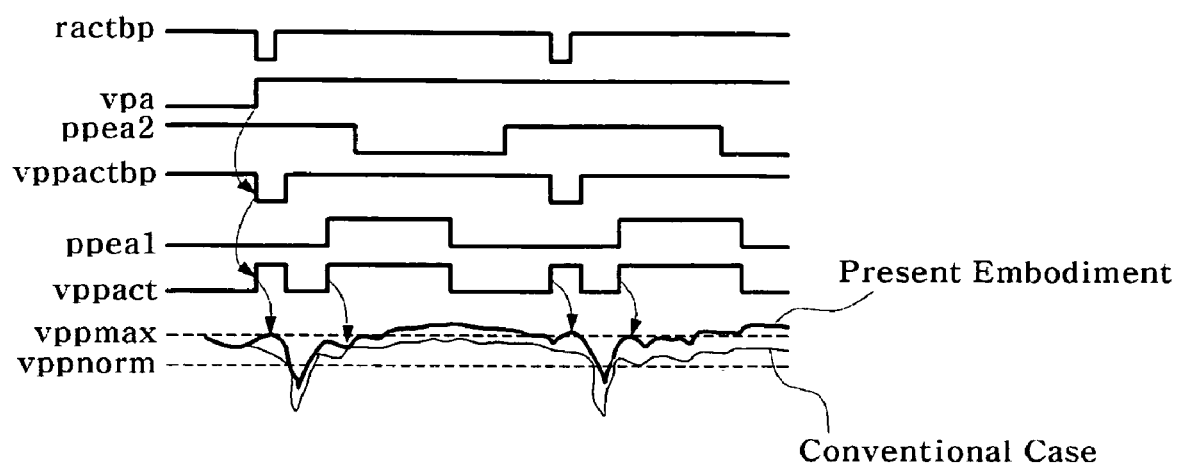
FIG. 8 is a timing diagram for explaining operation of the high voltage pumping device of FIG. 4.

When the row active signal ractbp transits from a high level to a low level when the active mode is begun, as shown in FIG. 8, the sensing unit 233 senses this transition, and outputs an activation sensing signal vppactbp which is enabled for a predetermined period. Of course, the sensing unit 233 activates the activation sensing signal vppactbp only when the pumping enable signal ppea2 is enabled.

That is, in the configuration of the sensing unit 233 shown in FIG. 6A, the pumping enable signal ppea2 is applied to a logic unit 301 which also receives a signal output from an inverter IV31 which inversely buffers the row active signal ractbp. The logic unit 301 ANDs the signals received thereto, using a NAND gate ND31 and an inverter IV32. When the high voltage VPP is not lower than the maximum allowable voltage, the logic unit 301 outputs a low-level signal because the pumping enable signal ppea2 received from the second high voltage detector 220 has a low level. The low-level signal from the logic unit 301 is applied to a NOR gate NR31 which, in turn, outputs an activation sensing signal vppactbp transited to a disable state (namely, a high level), in response to the low-level signal and an output signal from a delay 302.

On the other hand, when the high voltage VPP is lower than the maximum allowable voltage, the voltage pumping enable signal ppea2 has a high level. When the row active signal ractbp transits to a low level when the active mode is begun, the logic unit 301 outputs a high-level signal, as shown in FIG. 8. As a result, the NOR gate NR31 outputs an activation sensing signal vppactbp transited to an enable state (namely, a low level), in response to the high-level signal. When the row active signal ractbp subsequently re-transits to a high level, the logic unit 301 outputs a low-level signal. Meanwhile, the delay 302 outputs a signal having a previous level (namely, a high level), for a predetermined delay period. Accordingly, the activation sensing signal vppactbp is maintained at a low level for the predetermined delay period. After the predetermined delay period elapses, the output of the delay 302 transits to a low level. In this state, the activation sensing signal vppactbp output from the NOR gate NR31 transits to a high level (namely, a disable state). Accordingly, when the row active signal ractbp transits from a high level to a low level when the active mode is begun under the condition in which the pumping enable signal ppea2 has transited to a high level (namely, an enable state), the activation sensing signal vppactbp output from the sensing unit 233 transits to a low level (namely, an enable state), and is maintained at the enable state for a period slightly longer than the activation period of the row active signal ractbp, as shown in FIG. 8. It is possible to control the period, for which the activation sensing signal vppactbp is enabled, by controlling the delay period of the delay 302. FIG. 6B illustrates a more detailed configuration of the sensing unit 233 shown in FIG. 6A.

In the configuration of FIG. 5, the pumping control signal generator 230, the activation sensing signal vppactbp is input to a NAND gate ND22 which, in turn, outputs a pumping control signal vppact. As shown in FIG. 8, the pumping control signal vppact transits to a high level (namely, an active state), in response to transition of the row active signal ractbp from a high level to a low level carried out when the active mode is begun, and is maintained in the active state for a predetermined period.

In the configuration of FIG. 4, the oscillator 240 generates the oscillation signal osc in response to the pumping control signal vppact which has a high level. In response to the oscillation signal osc, the pumping unit 250 performs a high-voltage pumping operation. Thus, an initial high voltage pumping operation is carried out when the active mode is begun, in accordance with the preferred embodiment of the present disclosure, differently from conventional cases. Accordingly, as shown in FIG. 8, it is possible to maintain the high voltage VPP at a predetermined level when the active mode is begun, without causing excessive drop of the high voltage VPP.

Meanwhile, after the activation sensing signal subsequently transits to a high level, the high voltage pumping device performs a pumping operation in the active mode period, in response to the pumping enable signal ppeal, until the precharge signal rpcgbp is enabled. This will be described in detail. First, the latching unit 231 of the pumping control signal generator 230 shown in FIG. 5 latches the row active signal ractbp, and outputs the control signal rastb which is maintained at a low level (namely, in an active state), from the point of time when the row active signal ractbp is activated to the point of time when the precharge signal rpcgbp is activated (namely, the active mode period). In this case, the latching unit 231 may have the same configuration as latches used in conventional high voltage pumping devices.

Figure 7:
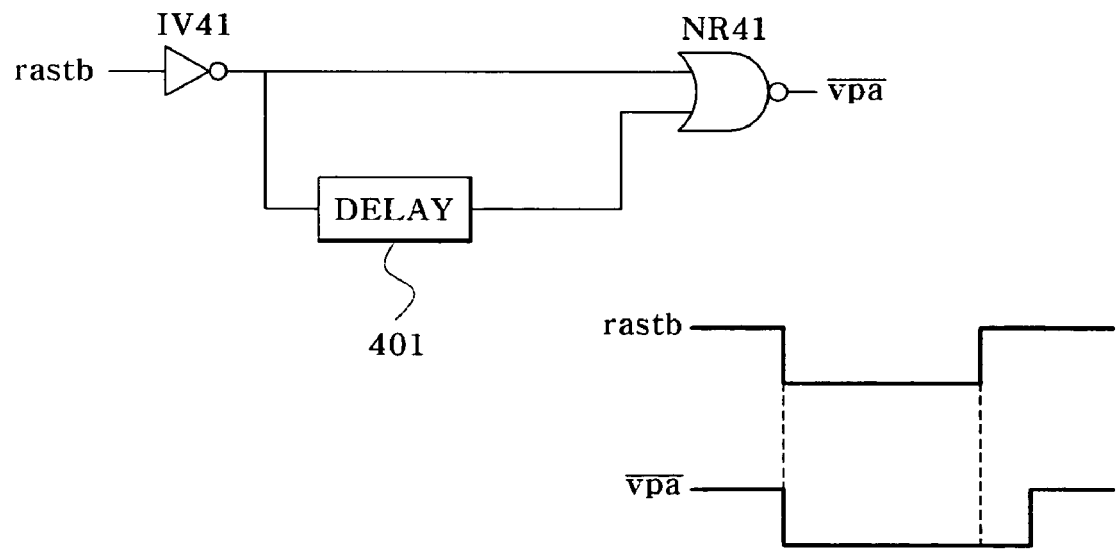
FIG. 7 is a circuit diagram illustrating a configuration of a delay included in the pumping control signal generator of FIG. 5, together with a timing diagram of input and output signals associated with the pumping control signal generator.

The delaying unit 232 delays the control signal rastb for a predetermined period. In particular, the delaying unit 232 delays the active state of the control signal rastb for the predetermined period. As a result, the control signal vpa, which is output from an inverter IV21, is maintained at a high level (namely, in an enable state), for the active mode period, as shown in FIG. 8. FIG. 7 illustrates a preferred embodiment of the delaying unit 232. The delaying unit 232 shown in FIG. 7 functions to output a signal input thereto after delaying the input signal for a predetermined period.

In the configuration of FIG. 5, the control signal vpa is applied to a NAND gate ND21 which, in turn, NANDs the control signal vpa with the pumping enable signal ppeal, and outputs the resulting signal to the NAND gate ND22. The NAND gate ND22 NANDs the output signal of the NAND gate ND21 with the activation sensing signal vppactbp, and outputs the resulting signal as the pumping control signal vppact. Since each of the control signal vpa and activation sensing signal vppactbp has a high level, the pumping control signal vppact is maintained at a high level (namely, in an active state), for a period in which the pumping enable signal ppeal is maintained at a high level (namely, in an enable state).

When the pumping control signal vppact transits to a high level (namely, an active state), as described above, the oscillator 240 generates the oscillation signal osc in response to the pumping control signal vppact. In response to the oscillation signal osc, the pumping unit 250 performs a high voltage pumping operation. Thus, when the pumping enable signal ppeal transits to an enable state in the active mode in response to the high voltage VPP, which is lower than the predetermined reference voltage, the pumping unit 250 performs the high voltage pumping operation, to maintain the high voltage VPP in a predetermined range.

Thus, the high voltage pumping device according to the preferred embodiment of the present disclosure performs an initial high voltage pumping operation for a predetermined period when the active mode is begun, thereby preventing the level of the high voltage from being excessively dropped below an appropriate range due to an excessive use of the high voltage in an initial stage of the active mode, and thus, enabling the operation of sense amplifiers and activation of word lines to be normally carried out. Accordingly, it is possible to prevent the semiconductor memory device from operating erroneously.

As apparent from the above description, the present disclosure provides a high voltage pumping device which enables a semiconductor memory device to operate normally, by preventing the level of a high voltage used in the semiconductor memory device from being excessively dropped below an appropriate range due to an excessive use of the high voltage when the semiconductor memory device enters an active mode, and thus, maintaining the level of the high voltage within the appropriate range.

Although the preferred embodiments of the disclosure have been described herein for illustrative purposes, those skilled in the art will appreciate that various modifications, additions and substitutions are possible, without departing from the scope and spirit of the disclosure and the accompanying claims.

The present application is based on and claims priority to Korean patent application No. 10-2006-0033333, filed on Apr. 12, 2006, which is incorporated by reference in its entirety.

What is claimed is:

1. A high voltage pumping device comprising:
   a first high voltage detector configured to detect a level of a high voltage, and generate a first pumping enable signal which is enabled when the high voltage is lower than a predetermined reference voltage;
   a pumping control signal generator configured to generate a pumping control signal adapted to control a high voltage pumping operation, in response to the first pumping enable signal and a first control signal which is enabled for a first period when an active mode has begun;
   an oscillator configured to generate a predetermined oscillation signal in response to the pumping control signal; and
   a pumping unit configured to pump the high voltage to a predetermined level in response to the oscillation signal supplied from the oscillator,
   wherein the high voltage pumping device performs an initial high voltage pumping operation for a second period in response to the first control signal when the active mode has begun, and subsequently performs a high voltage pumping operation in the active mode in response to the first pumping enable signal when the high voltage is lower than the predetermined reference voltage, and
   wherein the pumping control signal generator comprises:
   a latch configured to latch the first control signal, and output a second control signal which is maintained in an active state during the active mode;
   a first buffer configured to buffer the second control signal;
   a first logic unit configured to perform a first logical operation of the first pumping enable signal and an output signal from the first buffer, and output a result of the first logical operation;

a sensing unit configured to sense an activation of the first control signal, and generate an activation sensing signal which is enabled for the second period; and a second logic unit configured to perform a second logical operation of an output signal from the first logic unit and the activation sensing signal.

2. The high voltage pumping device according to claim 1, wherein the initial high voltage pumping operation is performed only when the high voltage is lower than a predetermined maximum allowable voltage.

3. The high voltage pumping device according to claim 2, further comprising:

a second high voltage detector configured to detect the level of the high voltage, and generate a second pumping enable signal which is enabled when the high voltage is lower than the predetermined maximum allowable voltage.

4. The high voltage pumping device according to claim 3, wherein the pumping control signal generator receives the second pumping enable signal, and enables the pumping control signal for the second period in response to the second pumping enable signal and the first control signal when the active mode has begun, while enabling the pumping control signal during the active mode in response to the first pumping enable signal.

5. The high voltage pumping device according to claim 1, wherein the latch maintains the second control signal in the active state until a precharge signal is enabled.

6. The high voltage pumping device according to claim 1, wherein the pumping control signal generator further comprises:

a delaying unit configured to delay the second control signal output from the latch, and output the delayed second control signal to the first buffer.

7. The high voltage pumping device according to claim 6, wherein the delaying unit delays the active state of the second control signal for a predetermined period.

8. The high voltage pumping device according to claim 7, wherein the delaying unit comprises:

a second buffer configured to buffer the second control signal;

a delay configured to delay an output signal from the second buffer for a predetermined period; and a third logic unit configured to perform a third logical operation of the output signal from the second buffer and an output signal from the delay.

9. The high voltage pumping device according to claim 8, wherein the third logic unit performs a NOR operation.

10. The high voltage pumping device according to claim 1, wherein the sensing unit comprises:

a second buffer configured to buffer the first control signal;

a third logic unit configured to perform a third logical operation of an output signal from the second buffer and the second pumping enable signal;

a delay configured to delay an output signal from the third logic unit for a predetermined period; and a fourth logic unit configured to perform a fourth logical operation of the output signal from the third logic unit and an output signal from the delay.

11. The high voltage pumping device according to claim 10, wherein the third logic unit performs an AND operation, and the fourth logic unit performs a NOR operation.

12. The high voltage pumping device according to claim 1, wherein each of the first and second logic units performs a NAND operation.

13. The high voltage pumping device according to claim 1, wherein the first control signal is a row active signal.

14. A high voltage pumping device comprising:

a first high voltage detector configured to detect a level of a high voltage, and generate a first pumping enable signal which is enabled when the high voltage is lower than a predetermined reference voltage;

a second high voltage detector configured to detect the level of the high voltage, and generate a second pumping enable signal which is enabled when the high voltage is lower than a predetermined maximum allowable voltage;

a pumping control signal generator configured to generate a pumping control signal in response to the first pumping enable signal, the second pumping enable signal, and a first control signal which is enabled for a first period when an active mode has begun, the pumping control signal being enabled for a second period in response to the second pumping enable signal and the first control signal when the active mode has begun, while being enabled in response to the first pumping enable signal during the active mode;

an oscillator configured to generate a predetermined oscillation signal in response to the pumping control signal; and a pumping unit configured to perform a pumping operation in response to the oscillation signal supplied from the oscillator, wherein the pumping control signal generator comprises:

a latch configured to latch the first control signal, and output a second control signal which is maintained in an active state during the active mode;

a first buffer configured to buffer the second control signal;

a first logic unit configured to perform a first logical operation of the first pumping enable signal and an output signal from the first buffer, and output a result of the first logical operation;

a sensing unit configured to sense an activation of the first control signal, and generate an activation sensing signal which is enabled for the second period; and a second logic unit configured to perform a second logical operation of an output signal from the first logic unit and the activation sensing signal.

15. The high voltage pumping device according to claim 14, wherein the pumping control signal generator further comprises:

a delaying unit configured to delay the second control signal output from the latch, and output the delayed second control signal to the first buffer.

16. The high voltage pumping device according to claim 14, wherein the sensing unit comprises:

a second buffer configured to buffer the first control signal;

a third logic unit configured to perform a third logical operation of an output signal from the second buffer and the second pumping enable signal;

a delay configured to delay an output signal from the third logic unit for a predetermined period; and a fourth logic unit configured to perform a fourth logical operation of the output signal from the third logic unit and an output signal from the delay.

17. The high voltage pumping device according to claim 16, wherein the third logic unit performs an AND operation, and the fourth logic unit performs a NOR operation.

18. The high voltage pumping device according to claim 14, wherein each of the first and second logic units performs a NAND operation.

19. The high voltage pumping device according to claim 14, wherein the first control signal is a row active signal.

* * * * *